US008843605B2

(12) United States Patent
Seminaro et al.

(10) Patent No.: US 8,843,605 B2
(45) Date of Patent: *Sep. 23, 2014

(54) METHOD AND SYSTEM FOR FILTERING AND SUPPRESSION OF TELEMETRY DATA

(75) Inventors: Michael D. Seminaro, New York, NY (US); Christopher E. Mar, Leesburg, VA (US); Jon D. Greaves, Aldie, VA (US)

(73) Assignee: Oracle International Corporation, Redwood Shores, CA (US)

( * ) Notice: Subject to any disclaimer, the term of this patent is extended or adjusted under 35 U.S.C. 154(b) by 1983 days.

This patent is subject to a terminal disclaimer.

(21) Appl. No.: 11/151,665

(22) Filed: Jun. 14, 2005

(65) Prior Publication Data
US 2005/0273593 A1 Dec. 8, 2005

Related U.S. Application Data

(63) Continuation-in-part of application No. 10/452,933, filed on Jun. 3, 2003, now abandoned.

(60) Provisional application No. 60/384,392, filed on Jun. 3, 2002

(51) Int. Cl.
| | |
|---|---|
| *G06F 15/173* | (2006.01) |
| *H04L 12/26* | (2006.01) |
| *H04L 12/24* | (2006.01) |
| *H04L 29/06* | (2006.01) |
| *H04L 29/08* | (2006.01) |
| *H01L 43/06* | (2006.01) |

(52) U.S. Cl.
CPC ........ *H04L 41/0604* (2013.01); *H04L 12/2602* (2013.01); *H04L 41/147* (2013.01); *H04L 29/06* (2013.01); *H04L 43/10* (2013.01); *H04L 69/164* (2013.01); *H01L 43/06* (2013.01); *H04L 41/046* (2013.01); *H04L 43/12* (2013.01); *H04L 67/02* (2013.01); *H04L 41/0686* (2013.01); *H04L 41/069* (2013.01); *H04L 43/103* (2013.01); *H04L 41/0266* (2013.01); *H04L 43/0811* (2013.01); *H04L 69/16* (2013.01); *H04L 41/026* (2013.01); *H04L 41/0856* (2013.01); *H04L 43/00* (2013.01); *H04L 41/0213* (2013.01)
USPC .......................................................... 709/223

(58) Field of Classification Search
CPC ... H04L 41/0604; H04L 41/06; H04L 41/046; H04L 12/2602
USPC .......... 709/224, 223, 202, 218; 719/318, 316; 706/45, 47, 917, 46, 50, 11, 916, 48, 706/10, 911
See application file for complete search history.

(56) References Cited

U.S. PATENT DOCUMENTS

| | | | | |
|---|---|---|---|---|
| 4,672,572 | A | * | 6/1987 | Alsberg ........................... 726/11 |
| 5,621,663 | A | * | 4/1997 | Skagerling .................... 702/186 |

(Continued)

OTHER PUBLICATIONS

International Search Report for PCT/US03/17264 mailed Oct. 23, 2003.

*Primary Examiner* — Luat Phung
*Assistant Examiner* — Saad A Waqas
(74) *Attorney, Agent, or Firm* — Marsh Fischmann & Breyfogle LLP; Jonathon A. Szumny

(57) ABSTRACT

Embodiments of the invention are directed generally to data filtering methods, and combinations thereof, for reducing the quantity of non-actionable, redundant, or otherwise unnecessary data events reported to a network management system. According to an embodiment of the invention, a method for filtering event data in a network comprises: defining a plurality of discrete filtering rules, each of the plurality of rules performing at least one of a permit, deny, log, and rewrite function; assembling at least a first and second of the plurality of rules into an ordered sequence to form a first rule set; assembling at least a third and a fourth of the plurality of rules into an ordered sequence to form a second rule set; employing the first rule set in an appliance associated with a customer network; and employing the second rule set in a server associated with a network management system.

23 Claims, 12 Drawing Sheets

(56) References Cited

U.S. PATENT DOCUMENTS

| | | |
|---|---|---|
| 6,185,613 B1 * | 2/2001 | Lawson et al. ............... 709/224 |
| 6,292,838 B1 | 9/2001 | Nelson |
| 6,397,359 B1 | 5/2002 | Chandra et al. |
| 6,404,743 B1 | 6/2002 | Mendzija |
| 6,829,639 B1 * | 12/2004 | Lawson et al. ............... 709/224 |
| 7,136,920 B2 * | 11/2006 | Castell et al. ............... 709/224 |
| 7,188,170 B1 * | 3/2007 | Burnley et al. ............... 709/224 |
| 7,213,065 B2 * | 5/2007 | Watt ............... 709/223 |
| 7,376,969 B1 * | 5/2008 | Njemanze et al. ............... 726/22 |
| 2005/0203921 A1 * | 9/2005 | Newman et al. ............... 707/100 |
| 2007/0088839 A1 * | 4/2007 | Yoakum ............... 709/228 |

* cited by examiner

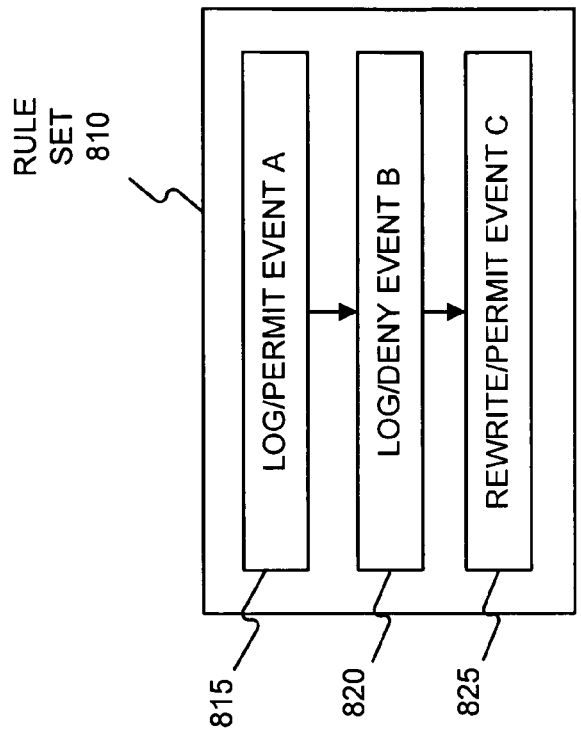
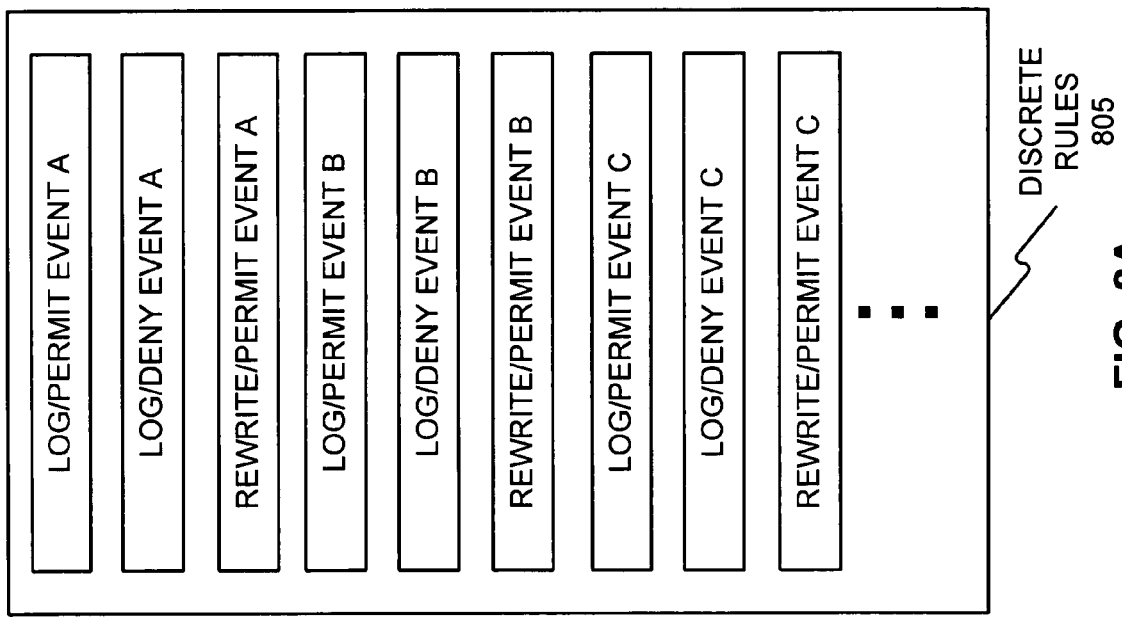

METHOD AND SYSTEM FOR FILTERING AND SUPPRESSION OF TELEMETRY DATA

CROSS-REFERENCE TO RELATED APPLICATIONS

The present application is a Continuation-in-Part (CIP) of U.S. patent application Ser. No. 10/452,933, filed Jun. 3, 2003 now abandoned, which claims priority under 35 U.S.C. §119 (e) to U.S. Provisional Patent Application No. 60/384,392, filed Jun. 3, 2002. U.S. patent application Ser. No. 10/452,933 and 60/384,392 are hereby incorporated by reference in their entirety. Two non-provisional U.S. Patent Applications, entitled "Method and System For Remote Management of Customer Servers," U.S. application Ser. No. 11/151,646, and "Method and System for Relocating and using Enterprise Management Tools in a Service Provider Model", U.S. application Ser. No. 11/151,645, filed concurrently herewith, are hereby incorporated by reference in their entirety.

FIELD OF THE INVENTION

The present invention relates to the monitoring and management of devices or appliances using a network management system and the like.

BACKGROUND OF THE INVENTION

In the field of network management, software agents installed on managed network devices are used to collect telemetry data (also referred to herein as event data) from the managed network devices. Many disadvantages exist with the use of such agents, however. For example, the quality of telemetry data originated from such agents is directly related to the capabilities of the deployed agents. And many agents lack fine grain controls to discriminate between significant and insignificant events. Thus, the agents may send all event data of a particular severity to a management server, resulting in a poor ratio in the number of actionable events compared to the total number of events received at the management server.

What is needed is a system and method for filtering and suppressing event data in a way that removes non-actionable or otherwise unnecessary event data. A structured feedback mechanism is also needed so that such filtering can be improved over time.

SUMMARY OF THE INVENTION

Embodiments of the invention are directed generally to data filtering methods, and combinations thereof, for reducing the quantity of non-actionable, redundant, or otherwise unnecessary data events reported to a network management system. In embodiments of the invention, the system components that are configured to perform the filtering are distributed across different portions of the functional architecture.

An embodiment of the invention provides a method for filtering event data in a network including: defining a plurality of discrete filtering rules, each of the plurality of rules performing at least one of a permit, deny, log, and rewrite function; assembling at least a first and second of the plurality of rules into an ordered sequence to form a first rule set; assembling at least a third and a fourth of the plurality of rules into an ordered sequence to form a second rule set; employing the first rule set in an appliance associated with a customer network; and employing the second rule set in a server associated with a network management system.

An embodiment of the invention provides a method for filtering event data in a network including: receiving a filtered event, the filtered event being an event that has been promoted by a plurality of event data filters; determining whether the filtered event is actionable; if the filtered event is actionable, taking remedial action; and if the filtered event is not actionable, modifying at least one of the plurality of event data filters.

An embodiment of the invention provides a method for filtering event data in a network including: receiving a first event and a second event; determining whether the first event and the second event originated from the same device; if the first event and the second event originate from the same device, determining whether the second event is duplicative of the first event based; and if the second event is duplicative of the first event, deleting the second event.

An embodiment of the invention provides a method for filtering event data in a network including: receiving event data from a managed device; converting a native protocol of the event data to XML to produce an XML message, the XML message having a native device IP address and an appliance identifier; filtering the XML message using at least one discrete rule, the at least one discrete rule including at least one of a permit, deny, log, and rewrite function, the filtering performed using a regular expression.

Advantageously, embodiments of the invention reduce the number of non-actionable or otherwise unwanted events received at a network management system.

Additional features of the invention will be set forth in part in the description which follows, and in part will be obvious from the description, or may be learned by practice of the invention. The features of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

FIG. 8A is a schematic diagram of exemplary filtering rules;

FIG. 8B is a schematic diagram of a rule set, according to an embodiment of the invention;

DETAILED DESCRIPTION

Reference will now be made in detail to exemplary embodiments of the invention, examples of which are illustrated in the accompanying drawings. Wherever possible, the same reference numbers will be used throughout the drawings to refer to the same or like parts.

Figure 1:
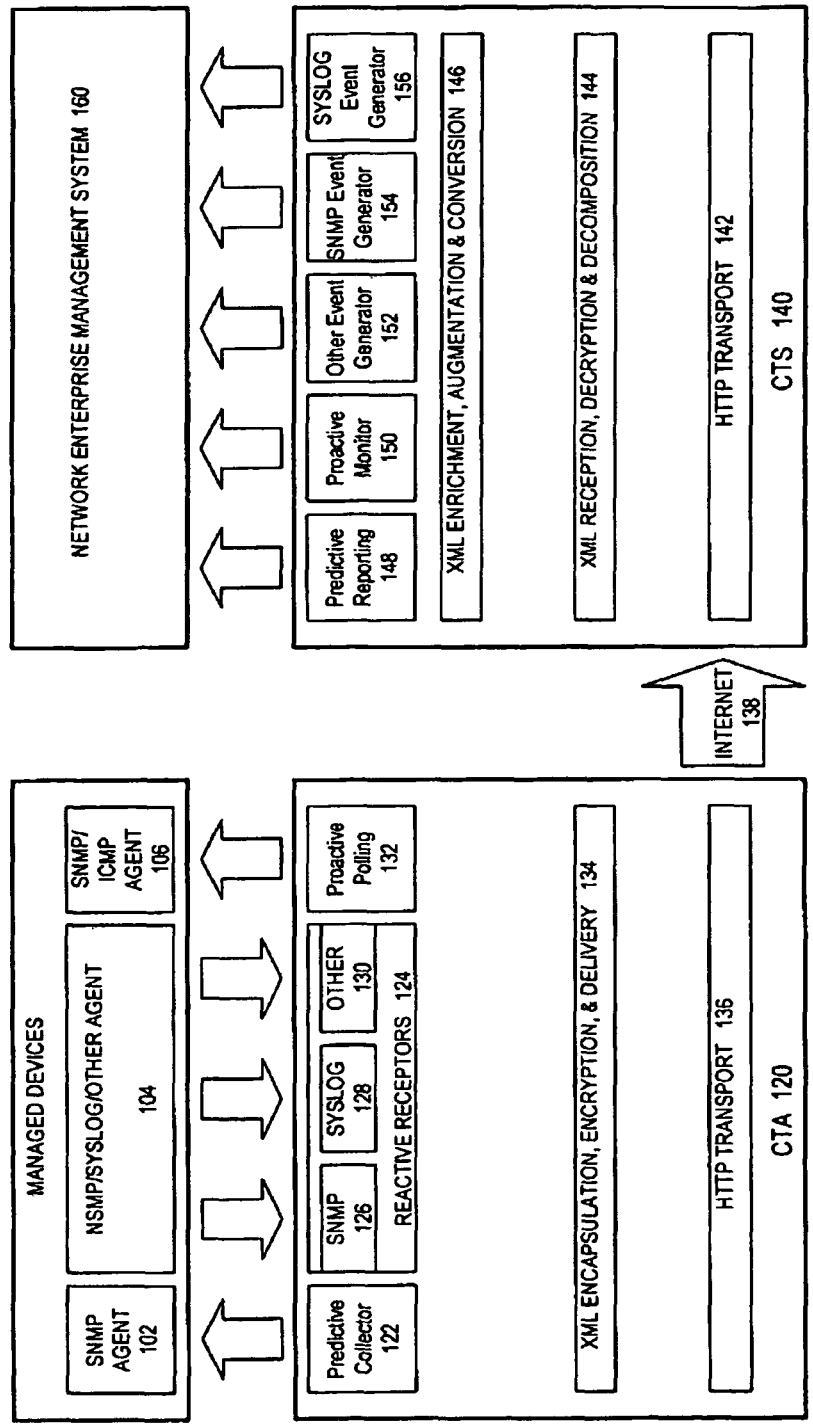
FIG. 1 illustrates the information flow and key components in one embodiment of the present invention.

FIG. 1 shows an information flow in accordance with some illustrative embodiments of the present invention. The event delivery system 100 in accordance with embodiments of the present invention may include two main components. First is a client receiver platform 120 (hereafter "control tower appliance" 120 or "CTA" 120) which is preferably a rack mountable platform deployed in a client cage which provides store and forward of event information and a secure management jump gate to reach client hosts. The CTA 120 may be deployed in one-to-one, one-to-many, or many-to-one configurations depending on customers/partners environment. Second is an event delivery server 140 (hereafter a "control tower server" 140 or "CTS" 140) which provides a unified and/or centralized event delivery mechanism for all CTAs and other future service platforms. The CTS 140 provides an extensible open standard based delivery platform of event information into core systems. A single CTS, such as CTS 140, will preferably support many customers and is easy to scale with additional computing resources. In general, information about events to be monitored or managed flows from information source(s) (hereafter "agents") to a CTA 120 and then to a CTS 140, from which the information is then passed to appropriate network management tools.

In some embodiments, applications will include those developed in Java. Java provides cross platform support and access to many libraries that already support various protocols used by event delivery system 100. This approach also provides a high degree of software re-use and the possibility of creating new products such as monitoring solutions requiring zero in cage hardware footprint.

CTA 120 and CTS 140 may use extended markup language (XML) to share data and configuration information between various components. XML has many advantages over other formats including its ability to be extended without reengineering applications. The event delivery system 100 may define an XML schema to describe event information. This schema allows any application that supports HTTP and XML to deliver events into particular systems (e.g., into SevenSpace systems in some embodiments).

As shown in FIG. 1, the event delivery system 100 includes the CTA 120 that receives reactive, proactive and/or predictive event information from at least one of managed device agents 102, 104, and 106. The CTA 120 preferably includes several lightweight software components. While these components are preferably targeted to be executed on the CTA platform, they could easily be executed on customer or partner hosts or the like to provide zero or substantially zero hardware footprint monitoring in cases where the customer only requires monitoring, or monitoring and reporting, on servers.

Devices produce reactive event information, for example, when they encounter an error or reporting condition. Reactive events are typically delivered in Simple Network Management Protocol (SNMP), System Log (Syslog) or other suitable formats. SNMP/Syslog formats may be considered unreliable due to their delivery being over the User Datagram Protocol/Internet Protocol (UDP/IP) protocol. Proactive events, for example, can be produced by an external entity (such as a CTA) polling the device to check its health. Predictive events, for example, can be produced by an external entity (again, such as a CTA) polling the device to collect performance metrics of the target device. Reactive, proactive and predictive events are collected by the client application using appropriate native protocols, such as SNMP trap, SNMP, Syslog, Remote Monitoring (RMON), Internet Control Message Protocol (ICMP) Ping and/or the like.

The CTA 120 includes reactive event receptors 124, which collect asynchronous events from monitored devices. Preferably, specific receptors may be developed to support the core monitoring technologies deployed. These may include a SNMP receptor 126 and an Syslog receptor 128. Using this model, the CTA 120 can be easily extended to support other future monitoring technologies, accommodated in a receptor 124. Events reported from agents 102, 104 and/or 106 are delivered over User Datagram Protocol (UDP) transport. UDP does not make provision for the sender to attempt retransmission should the receptor be blocked and is not able to process the inbound event. To minimize the risk of losing events, each receptor's function will be limited to receiving the event and queuing in the native format for additional processing.

The function of a predictive collector 122 is to perform SNMP polling operations to collect the appropriate values that are queued for delivery. Preferably, a CTS deferred reporting engine 154 breaks these requests back into the appropriate format for queuing in a data warehouse, which is included within enterprise network management system 160. In preferred embodiments, performing in this manner allows CT to preserve a near real time reporting capability.

A proactive polling module 132 provides a heartbeat module that delivers predictive monitoring. A heartbeat helps identify a properly functioning system from a disabled system. For example, if the receptors are not receiving events from a customer device, one of the following scenarios is true: the device is healthy and is not attempting to send events; or the device is hard down and not capable of generating events. Proactive polling element 132 provides an extra level of confidence that customer hosts are alive by performing SNMP "pings" of agents ensuring that, e.g., both the TCP/IP stack and agents are alive. The heartbeat will send the results of the "ping" to CTS 140 via an event delivery process. This information can be used to present up/down information on monitored systems and also validated by a CTS proactive monitor 150 to ensure the CTA 120 has checked in within an appropriate window and all monitored servers are well.

With the successful reception of event data from the managed devices by the CTA 120, an extensible mark-up language (XML) encapsulation, encryption and delivery module 134 begins a delivery phase to transport the data to a set of data monitoring and management tools. Each type of event received is encapsulated, for example, in the form of an XML message using predefined XML schemas. The XML message is encrypted, preferably using a common encryption protocol, for example, Twofish, Blowfish, Data Encryption Standard (DES), Advanced Encryption Standard (AES), or the like. Encrypted XML messages are delivered via Hyper Text Transfer Protocol (HTTP) protocol between CTA 120 and CTS 140. Should the connection between the CTA 120 and CTS 140 be unavailable, or the connection quality be deemed unsuitable for transport, the CTA 120 may look for alternative CTS servers located in diverse locations. If these are not available, the CTA 120 may act in a store and forward mode until such time that the connection is of sufficient quality to deliver event information.

An HTTP transport module 136 is responsible for the actual delivery of events from CTA 120 to CTS 140. It operates on the push paradigm and only requires an outbound channel from the customer's network to CTS 140 to operate. Events are encapsulated in either HTTP or HTTPS protocol for delivery. Confidentiality of the event traffic leaving the CTA 120 may be maintained by having the XML message encrypted before transmission. Thus, the system can achieve benefits of HTTPS without the overheads associated with that protocol. Using this mode of operation, the CTA 120 can sustain, in some embodiments, hundreds of events per second. Additionally, the HTTP protocol is also customer friendly in that most customers already permit outbound HTTP connections through their firewalls.

Data from the CTA 120 is passed via an Internet transport 138 to the CTS 140. (The data path between the CTA 120 and the CTS 140 is further depicted in FIG. 6.) Referring still to FIG. 1, while the CTS 140 may be designed to support the CTA 120 information, its open nature facilitates simple integration with future monitoring technologies. These include, for example, new agents and data collection products. The CTS 140 may also be deployed in multiple locations to provide geographic failover or event routing or the like.

An HTTP transport module 142 in the CTS 140 performs the actual receiving of events from the CTA 120 to the CTS 140. Data is passed from HTTP transport module 142 to an XML reception, decryption, and decomposition module 144 for further processing with the CTS 140.

The XML reception, decryption, and decomposition module 144 provides a reception and decomposition layer to ensure the successful delivery and acknowledgement of information from the CTA 120. Prior to an acknowledgement being issued, the information is checked for errors in data transmission using an md5 checksum or other method of checksum. Should the event fail its consistency check, the CTS 140 will preferably issue a failure status causing the event to be re-queued by the CTA 120 for retry delivery. As the CTS 140 receives each message, an acknowledgement is provided to the client instructing it that the message was both received and undamaged in transport. At this point, the client is permitted to remove the message from its outbound queue.

An event conversion, augmentation, enrichment module 146 may include some or all of the following features. Preferably, events are received by the server (CTS) application delivered over the HTTP protocol. The integrity and confidentially of these events are validated by the CTS application in module 146. Confirmation of successful reception is provided to the CTA application. CTS application decrypts event message to its XML message format. The XML message is augmented and enriched with additional contextual information. Preferably, conversion of any values such as IP addresses or host name references is performed by an XSL translation.

The proactive monitor 150 provides both a remote health check of all CTA/monitored devices and the simple up/down state of the device (e.g., shown by, for example, Spyglass or other proprietary applications that allow a client to view information stored in the CTA). In this regard, the heartbeat monitor preferably interfaces both with a client viewing application (e.g., Spyglass) and an object server. An object server provides a database that holds information to be presented to operators of the enterprise monitoring system tools so that new events can be identified and acted upon as they arrive. Preferably, should the heartbeat monitor detect a CTA that has not checked in within a pre-determined time or a customer's device that also has not checked in, an event can be generated to create an alert (e.g., to alert an operations center of the outage).

The enriched XML message is converted to its original native format (typically, SNMP trap, Syslog or another format) before being presented to tools supporting these native protocols (e.g., enterprise monitoring system) for presentation to analysts for evaluation. A predictive reporting module 148 inserts reporting data captured by the CTA 120 into a system (e.g., SevenSpace Inc.) data warehouse where it is available for reporting and trending.

When the originating device delivers events via SNMP to the CTA 120, it is necessary to enrich these events before presenting to the operations center. In this mode of operation, an SNMP event generator 154 reconstitutes the SNMP as an SNMP trap which looks identical to the event arriving at CTA 120 with any changes made during transformation. The event generator 154 preferably sends to a local probe within enterprise network management system 160 that contains rules to set severity and augment with any local inventory information. Preferably, address translation is performed at this point to cover customers who may have overlapping address spaces.

Per a similar model as the SNMP event generator 154, raw Syslog information is often too generic to be presented to a GMOC engineer for evaluation. In a Syslog event generator 156, the event may be reconstituted as a Syslog message and delivered to the local Syslog probe for evaluation against the Syslog rule set. Preferably, address translation is performed at this point to cover customers who may have overlapping address spaces. A similar process is also used for an other events generator 152.

Using the CTA 120 and CTS 140, event data is successfully and securely transferred from the managed devices to the enterprise network management system 160. The enterprise network management system 160 comprises a variety of data management tools known in the art to monitor, manage and report event data.

In preferred embodiments, the CTA 120 includes a rack mountable server with minimal CPU, memory and/or disk requirements and that allows a variety of vendors to be considered. In some embodiments, the operating system can be, e.g., a custom Linux Release to Manufacturing® distribution built to support specific CTA functions with all redundant applications stripped away. This distribution can be, e.g., heavily fortified with security features such as, e.g., Linux IPCHAINS stateful inspection firewall, Secure Shell (SSH), Tripwire and/or appropriate file system permissions to lock down the functions further. In addition, a journaling file system is preferably selected which may improve both performance and reliability of the platform.

CTS 140 provides a highly scalable platform to support event delivery and/or preferred polling support. A variety of server platforms may be used for CTS 140. In some embodiments, e.g., Sun Solaris based servers can be used to support the CTS 140 platform. These servers can run, e.g., Apache® web server with java servlet support.

Figure 2:
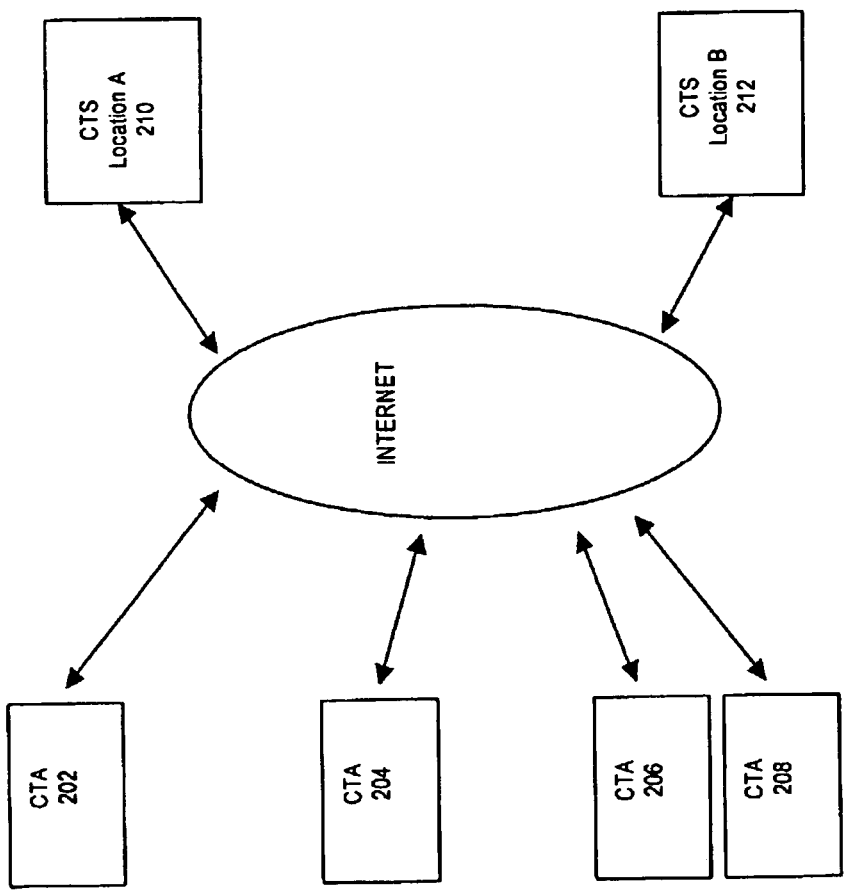
FIG. 2 is depicts a shared redundant platform in accordance with some illustrative embodiments.

FIG. 2 provides an illustration of a how the present invention can be configured with a shared redundant platform. Data from managed devices collected at CTA's 202, 204, 206, and 208 is passed via the Internet to one of two CTS locations 210 and 212. In this configuration, the CTS is deployed in multiple locations to provide geographic failover or event routing. For example, the system may be configured with a default that sends data from CTA 202 to CTS location 210. If the connection to CTS location 210 is interrupted or if CTS location 210 is otherwise inoperable, data from CTA 202 can alternatively be sent to CTS location 212. As another example, the system may be configured with defaults so that a particular type of data (e.g., proactive polling data) is sent to CTS location 210, while another data type (e.g., reactive SNMP data) is sent to CTS location 212. However, all data could be sent to one CTS, in the event of a failure at one of either CTS location 210 or 212.

Figure 3:
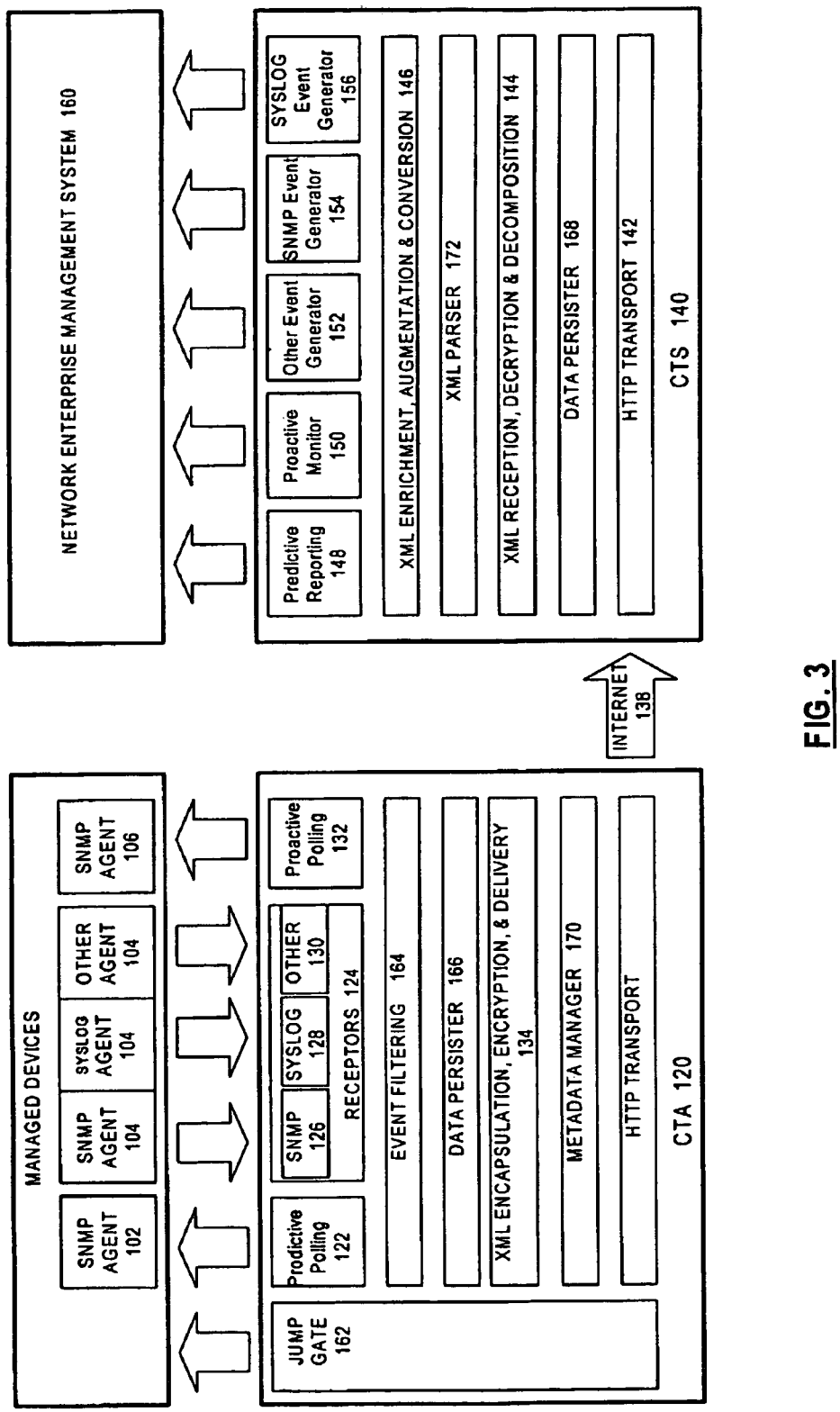
FIG. 3 is illustrates the information flow and key components in an embodiment of the present invention using a customer jump gate.

FIG. 3 illustrates the information flow and components of an event delivery system using a customer jump gate and other additional modules. Refer to jump gate module 162. A management company may require full management access to customer devices to perform fault remediation and root cause analysis. Management access can provide a number of challenges from both IP connectivity and security fronts. Use of CTA 120 can solve these issues by, e.g., using soft VPN's between metaframe management hosts distributed across the management company's infrastructure directly to the CTA 120. Once connected and authentication has taken place, CTA 120 may provide a jump point to manage customer devices. This approach can, e.g., resolve the need for network address translation to be performed since CTA 120 can, e.g., both have a public Internet address and be connected to, e.g., the customer's locally allocated address space defined by, for example, RFC1918.

In preferred embodiments, CTA 120 supports at least some, preferably all, of the following management protocols: 1 Protocol Use Telnet Basic network equipment (such as, e.g., Cisco) SSH Unix based hosts and encryption aware network devices X Unix hosts requiring X-windows management tools Virtual Network Computing (VNC) Support for VNC including tightlib compression and encryption and Windows and Unix platforms Window Terminal Services (RDP) Windows 2000 HTTP/S Launching web browsers to locally adminstrate applications (such as, e.g., Netscape admin server) PCAnywhere Support for Windows servers running PCAnywhere protocols.

Jump gate 162 can be used to unify these access methods to a single host to simplify remote support.

Refer now to event filtering module 164 of FIG. 3. Most devices capable of generating events make no provision to selectively chose events to send other than basic severity level settings. Event filter 164 provides a mechanism to squelch types of events or hosts from delivering information to the CTS 140. In some embodiments, filtered events are defined using XML showing the event schema field to search for and the string to match within the field. These strings may be expressed, e.g., as regular expressions to provide multiple matching (wildcards).

A data persistence layer 166 permits CTA 120 to operate in store-and-forward mode should the Internet connection to the CTS become unavailable. In this mode, the CTA 120 queues events for future delivery to ensure no events are lost in transit. In some embodiments, persister 166 only permits events from being "dequeued" on confirmation of event reception from the CTS 140. Thus, the system may be used to provide reliable delivery of events over potentially unreliable transport (such as, e.g., over the Internet). Each event is acknowledged by the CTS 140 on reception and only at this time are events "dequeued" by the persister. Corresponding to data persister 166, data persister 168 in the CTS 140 performs the same function for information transmissions from the CTS 140 back to the CTA 120.

CTA requires several items of metadata to describe a customer environment and support core operations. This may include, e.g., inventory information, address translation, polling intervals and/or values to be collected by the data collector. Collection and processing of this data is accomplished through metadata manager 170. Preferably, all metadata within the CT is stored in XML format. Among other things, this may provide a high degree of portability and/or easy interaction with CT components. In preferred embodiments, metadata is hosted on the CTS and transferred to the CTA on startup and configuration changes. Among other things, this mode of operation may allow for rapid swap outs of hardware should a failure occur.

In some illustrative embodiments, substantially any management company's support personnel with knowledge of the customer's systems will be able to provision the CTA 120. Preferably, the CTA 120 accomplishes such flexibility by the custom Linux® distribution being preloaded onto each CTA in base configuration. On first boot of the server, a series of questions will preferably drive the addressing, configuration and/or startup of CTA 120. Once deployed to a customer, CTA 120 will immediately make contact with the management company pushing its configuration back for archival. Should the CTA 120 suffer hardware failure, a process will preferably be provided to activate this backed up configuration on a clean box before reshipping. This automated approach minimizes deployment and support activities and leverages customer engineers who have detailed knowledge of a particular deployment.

Finally, FIG. 3 also depicts an XML parsing module 172 in CTS 140. XML parser 172 intercepts inbound messages from CTA and selects the appropriate interpreter to handle the data. This may be accomplished, e.g., by interpreting the XML data type field to select the correct handler to process the event.

Figure 4:
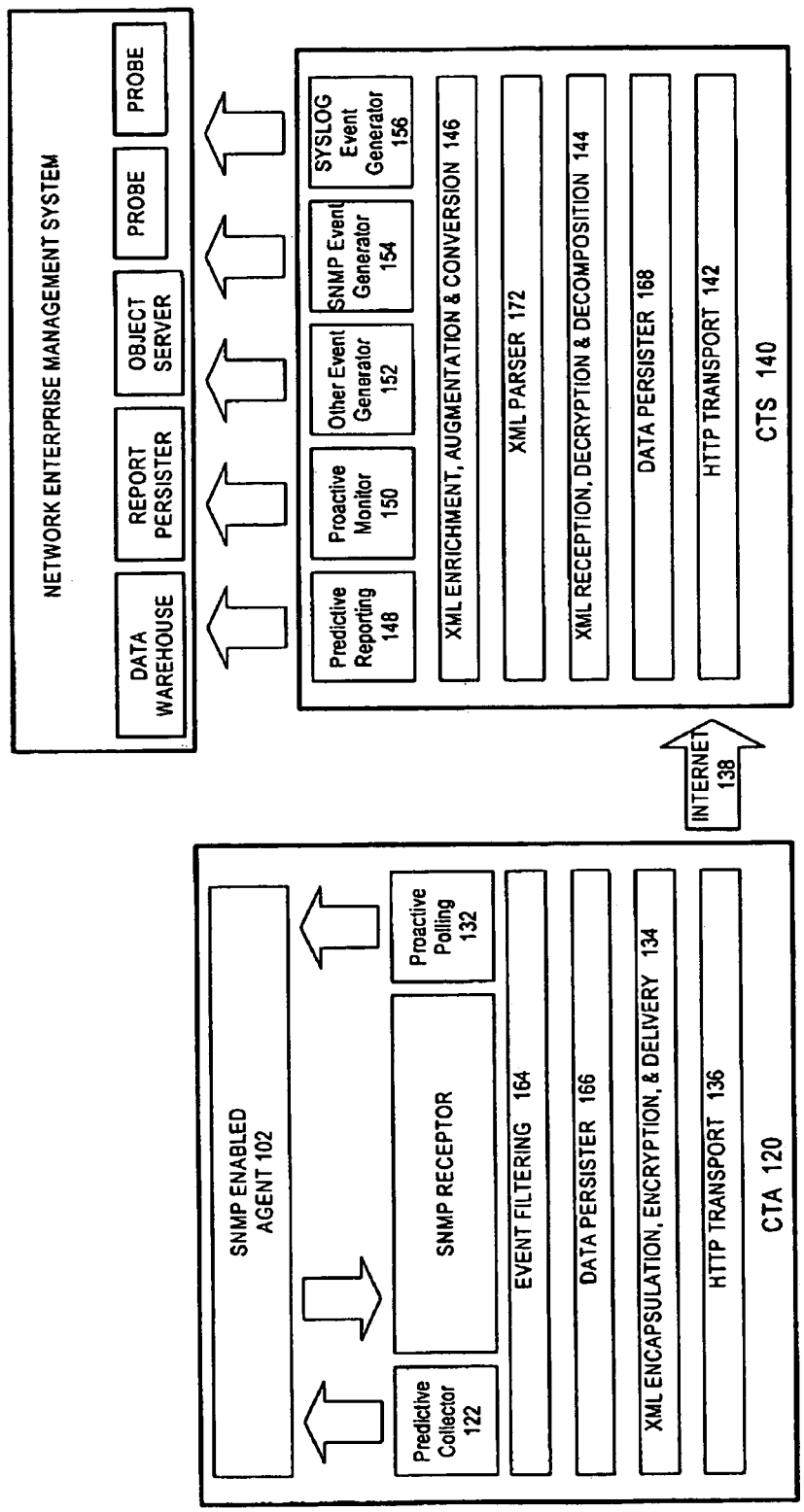
FIG. 4 illustrates the information flow and key components in an embodiment of the present invention using a software-only deployment.

FIG. 4 depicts an embodiment of the present invention using a substantially software deployment. In many cases, it is desirable to deploy the monitoring/reporting features of CT without or substantially without the additional cost of deploying a hardware solution. Particularly, for example, if a monitoring and/or management company is performing service on a limited number of hosts, a third party is providing the hands on remediation or is trailing such services.

In some embodiments, re-using the lightweight components of the CTA architecture, it is possible to deploy a minimal interface to allow the monitoring application agent (such a SysEdge™ agent) to fully interoperate with a CTS over the Internet using only push technology. This requires no inbound access to the customer network. Using this mode of operation allows a monitoring and/or management company to leverage its investment in the monitoring application and the effort in building out application specific configuration files to customers who do not warrant the deployment of a server solution.

In this model, the monitoring application may be configured to send event SNMP traps to its loop back address (back to itself without traversing down to the physical layer) where the receptor would process the event and deliver to the CTS. Moreover, the data collector and heartbeat modules may be deployed to provide proactive reporting and proactive monitoring services. In preferred embodiments, the overhead should be minimal and should comfortably run on many web, database and/or application server(s).

Figure 5:
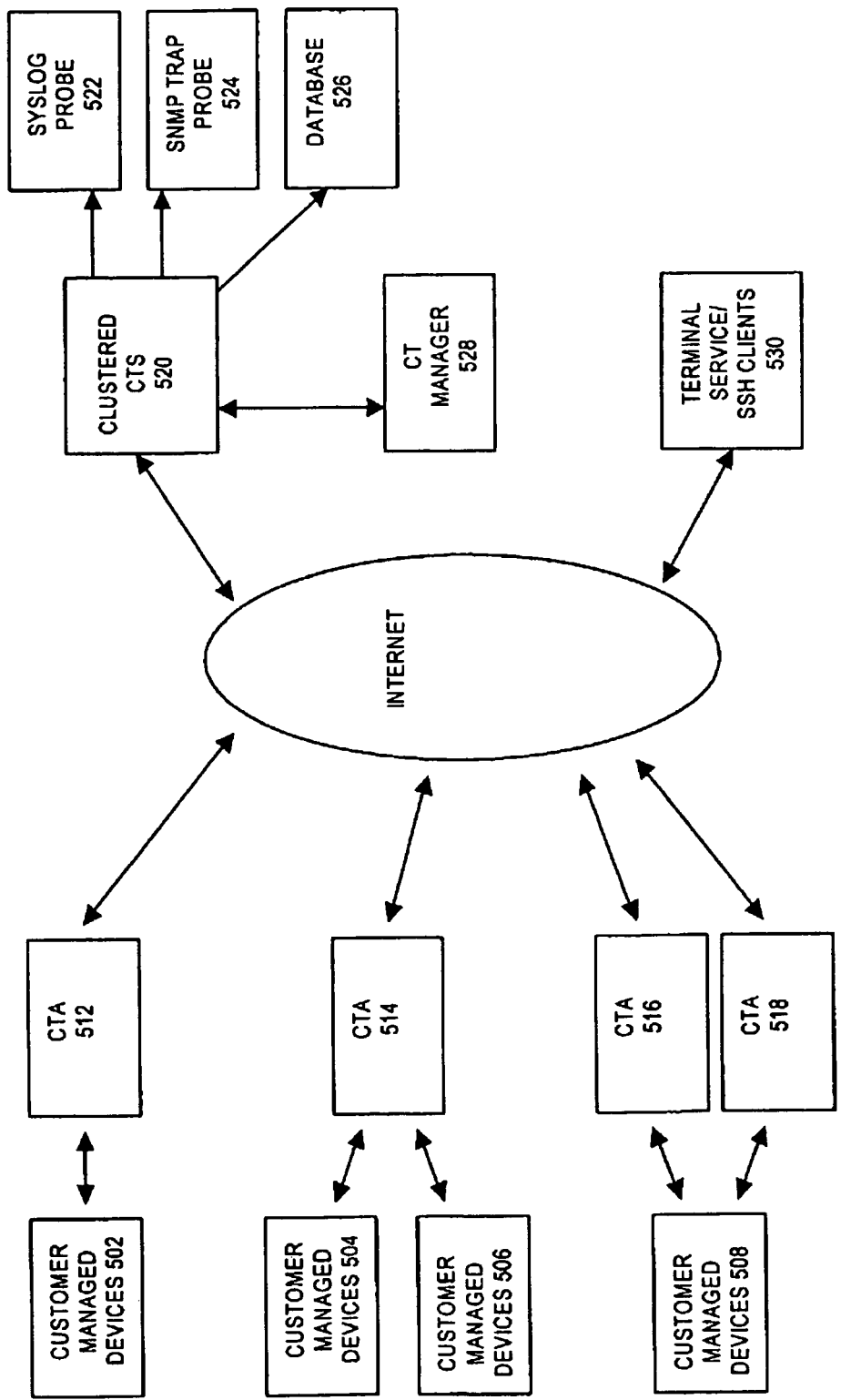
FIG. 5 provides an illustrative system view of the present invention.

FIG. 5 provides an illustrative system view of the control tower applied in a multiple client environment. Generally, CTA's may be deployed in one-to-one, one-to-many, or many-to-one configurations depending on customers/partners environment. In FIG. 5, Customer Managed Device (CMD) 502 is connected in a one-to-one relationship with CTA 512. CMD 504 and CMD 506 are connected with CTA 514 in an exemplary one-to-many relationship, so that both customers are able to report events from managed devices to single a CTA. A one-to-many relationship may be useful, for example, for customers with combined number of managed devices below the connection capacity of the CTA hardware to provide hardware cost savings. CMD 508 is connected with CTA in an exemplary many-to-one relationship, so that a single customer provides reporting data to more than one CTA. A many-to-one relationship may be useful, for example, for a customer who has a total number of devices that exceeds the connection capacity of a single CTA.

Still referring to FIG. 5, data transmitted to and from CTA's 512, 514, 516, and 518 may be securely transported via the Internet to a cluster of CTS's 520, including one or more CTS's. A single CTS will preferably support many customers and is easy to scale with additional computing resources. Data from each CMD 502, 504, 506, and 508 may be directed to an appropriate a local probe within a set of enterprise network management tools, such as Syslog probe 522 or SNMP trap probe 524. Customer data may also be routed to a local database connected to CTS cluster 520. Additionally, operations of CTS cluster 520 may be managed by a separate control tower manager 528 that is operatively connected to CTS cluster 520. Rather than to a CTS, data from CTAs 512, 514, 516, and 518 may also be securely transported via the Internet to a thin client architecture 530, such as Terminal Services or SSH clients.

Figure 6:
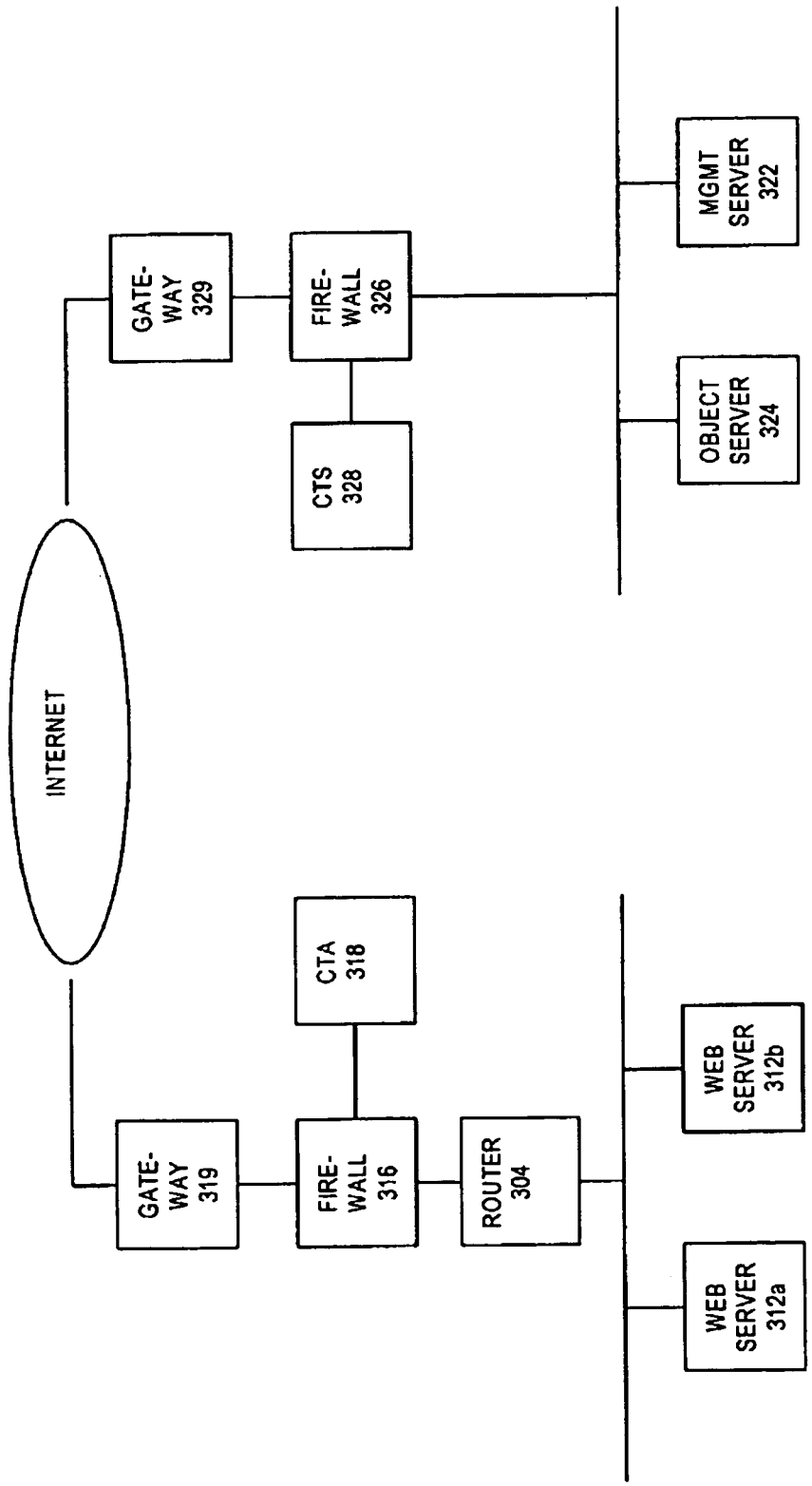
FIG. 6 provides an illustrative configuration of the present invention for a single customer.

FIG. 6 is an illustrative configuration for a single customer using one embodiment consistent with the present invention. Event data from a customer web servers 312a and 312b and from router 314 are passed to the customer's CTA 318. Reactive events are typically delivered to CTA 318 in SNMP or Syslog formats. Predictive collection and proactive polling may be delivered from the CTA to a client device via SNMP or ICMP formats. From CTA 318 data is passed over the Internet via a standard outbound HTTP connection through firewall 316 and gateway 319 using XML over HTTP. The data is received at CTS 328 located in a data management center network 320 through gateway 329 and firewall 326. The data is received and reformatted in CTS 328 and provided via TCP database inserts to an object server 324. The data is monitored and analyzed within data management center 320. Information from data management center 320 is provided for access by the client by sending data from Citrix® management server 322 back to CTA 318 via a virtual private network (VPN). Numerous other configurations using combinations of the above protocols, as well as those using different protocols are envisioned within the scope of the present invention.

Figure 7:
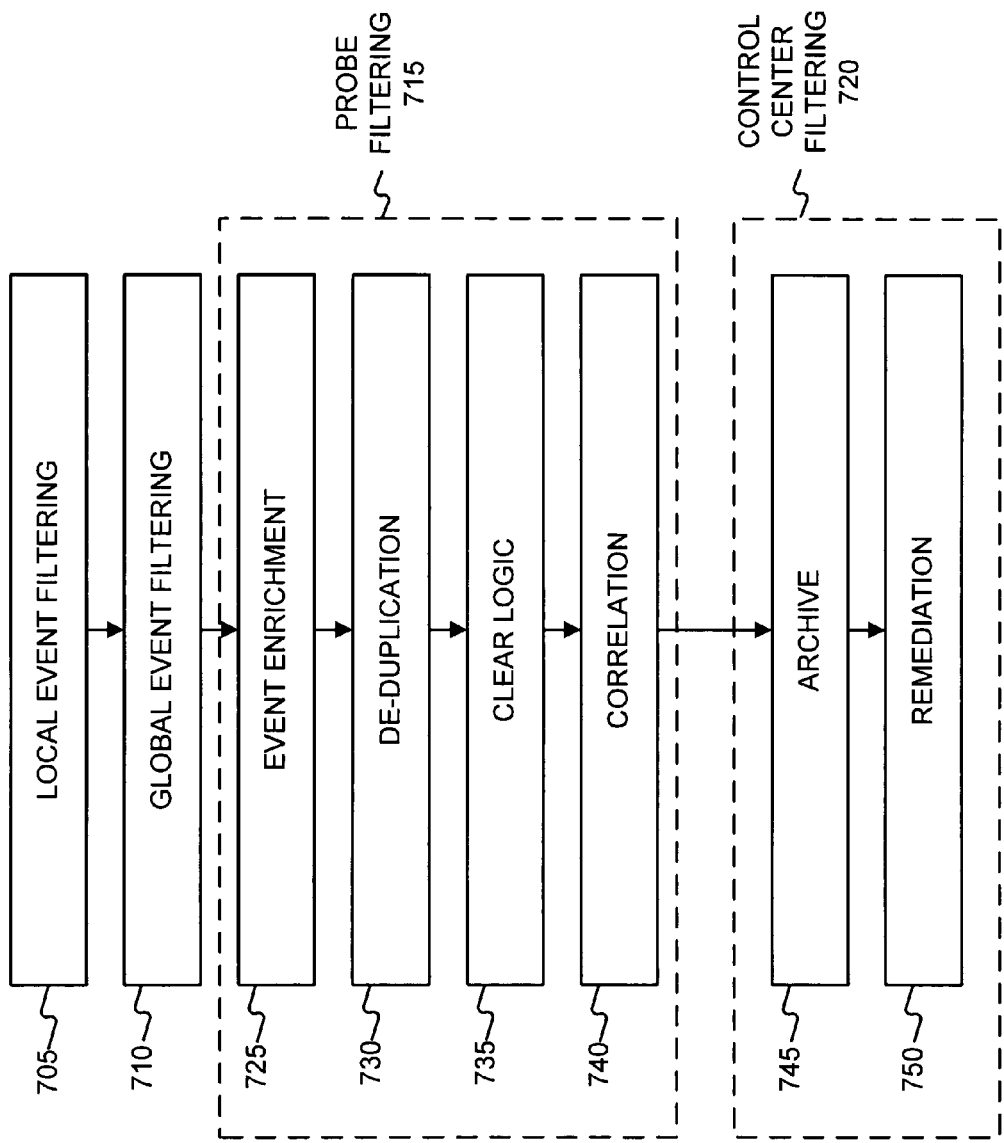
FIG. 7 is a flow diagram of a process for filtering event data, according to an embodiment of the invention.

FIG. 7 is a flow diagram of a process for filtering event data, according to an embodiment of the invention. As shown in FIG. 7, the process begins in step 705 with local event filtering, then proceeds to step 710 for global event filtering. Next, the process is advanced to probe filtering step 715 and control center filtering step 720.

Local event filtering step 705 may be performed, for example, at CTA 120 and global event filtering 710 may be performed at the CTS 140. In one embodiment of the invention, steps 705 and 710 are performed on event data that has been converted from a native device protocol to XML format. Filtering in step 705 and 710 may be performed using Regular Expressions (regex). A regex is a special textual string for describing a search pattern. Filtering steps 705 and 710 are described further with reference to FIGS. 8A, 8B, 9, 10A and 10B.

Probe-filtering step 715 may be performed in network management system 160. As used herein, a probe is a functional module that is configured to analyze SNMP trap data or similar data format. The probe may be, for example, a Micromuse NetCool TrapD probe. In the illustrated embodiment, probe-filtering step 715 includes event enrichment step 725, de-duplication step 730, clear logic step 735, and/or correlation step 740, each performed in series.

In event enrichment step 725, a probe may query inventory and account management databases (not shown) to enrich the event data with customer-specific information such as location, service level, etc. The enriched data may be used, for example, to identify devices that are in a change management cycle and should not generate actionable alarms. In de-duplication step 730, event data is deleted where an identical event has already been received from the same device. In this instance, an event counter may optionally be incremented. The processing in clear logic step 735 determines whether a received event cancels out previous event data received. An example is when a device is re-booted or otherwise reset, whether by human or automated process. Where such cancellation is appropriate, the current and previous related event data is erased. In correlation step 740, the process associates event data according to predetermined criteria. For example, multiple different events related to a single managed device within a predetermined timeframe may be correlated. Such event data may be expressed in a format such as "X events occurred during Y time on device Z."

Control center filtering step 720 may be performed in the network management system 160 and may optionally include archive step 745 and/or remediation step 750. In archive step 745, received event data may be stored for future use. Remediation step 750 involves corrective actions taken by a user at a network management console in response to the received event data. For example, an additional filtering step may be added, or an existing filtering step may be modified.

The filtering steps illustrated in FIG. 7 and described above facilitate the reduction in the quantity of event data that is reported to a network management system 160. For example, in an exemplary event data collection example, the CTA 120 may receive 8 million events per day. But the effect of local event filtering step 705 may be that the CTA 120 only promotes 3.5 million events to the CTS 140. Likewise, the effect of global event filtering step 710 may be that the CTS 140 only advances 26 thousand events, in the form of alarms, to a probe-filtering module (not shown). And the effect of probe filtering step 715 may be that only 1,200 actionable alarms are received from the probe-filtering module in a control center (not shown) of the network management system 160.

FIG. 8A is a schematic diagram of exemplary discrete filtering rules 805. As illustrated, any of the discrete filtering rules 805 may have the format of logging and permitting (log/permit) event data of a predetermined type, logging and denying (log/deny) event data of a predetermined type, or rewriting and permitting (rewrite/permit) event data of a predetermined type. In other embodiments, rules that permit or deny event data for a predetermined type without logging any indicia of the filtering performed may also be utilized. A rule may also be a global deny or a global permit as discussed with reference to FIGS. 10A and 10B, respectively. A permit allows event data to be promoted, a deny deletes event data, a log produces a record of the event data. Rewriting the event data may be useful in cases where the format of the event data may not be easily understood by later human or automated process.

FIG. 8B is a schematic diagram of a rule set, according to an embodiment of the invention. Multiple discrete filing rules 805 may be combined in a predetermined sequence to define a rule set. For example, in the illustrated embodiment, rules 815, 820, and 825 are combined in sequence to form rule set 810.

Figure 9:
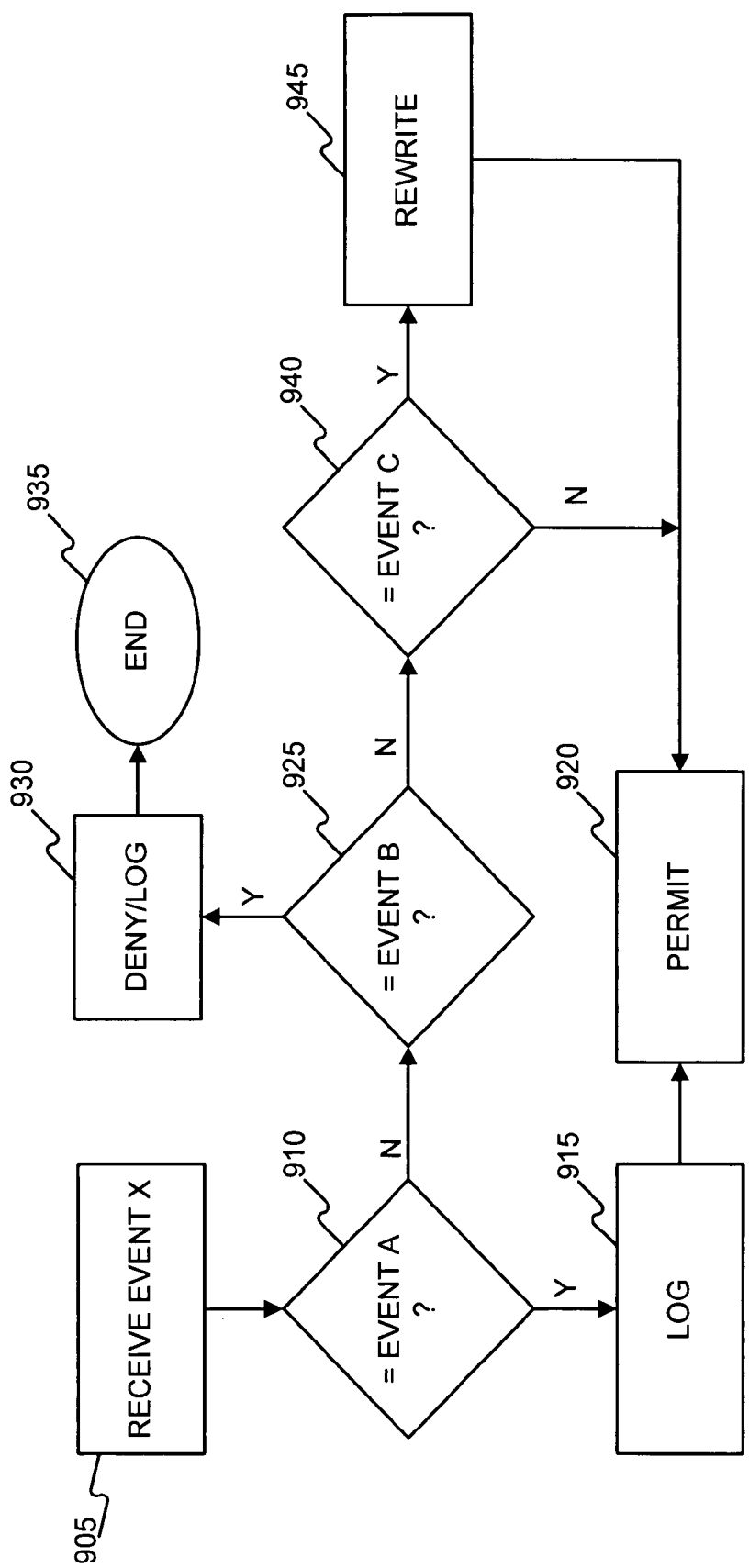
FIG. 9 is a flow diagram of rule set processing, according to an embodiment of the invention.

FIG. 9 is a flow diagram of rule set processing, according to an embodiment of the invention. FIG. 9 is an illustration of processing rule set 810. As shown in FIG. 9, the process begins by receiving event data X in step 905. Then, in conditional step 910, the process determines whether event X is equal to predetermined event A. If so, the process advances to logging step 915, then to permit step 920. Otherwise, the process advances to conditional step 925 to determine whether the event X is equal to predetermined event B. If so, the process is promoted to step 930 to deny and log the existence of event B data; the process then terminates in step 935. Otherwise, the process advances to conditional step 940 to determine whether the event X is equal to predetermined event C. If so, the process advances to step 945 to rewrite the event C data before continuing to permit step 920. Otherwise, event X is not equal to any of the predetermined events A, B, or C, and the process advances to permit step 920.

Thus, in the illustrated embodiment, event data not associated with a discrete filtering rule in the rule set 810 is reported to a next step of the filtering process illustrated in FIG. 7. In an alternative embodiment, the rule set 810 must include either a global deny rule (not shown) or a global permit rule (not shown) to handle the case where not one of events A, B, or C are matched.

Figure 10:
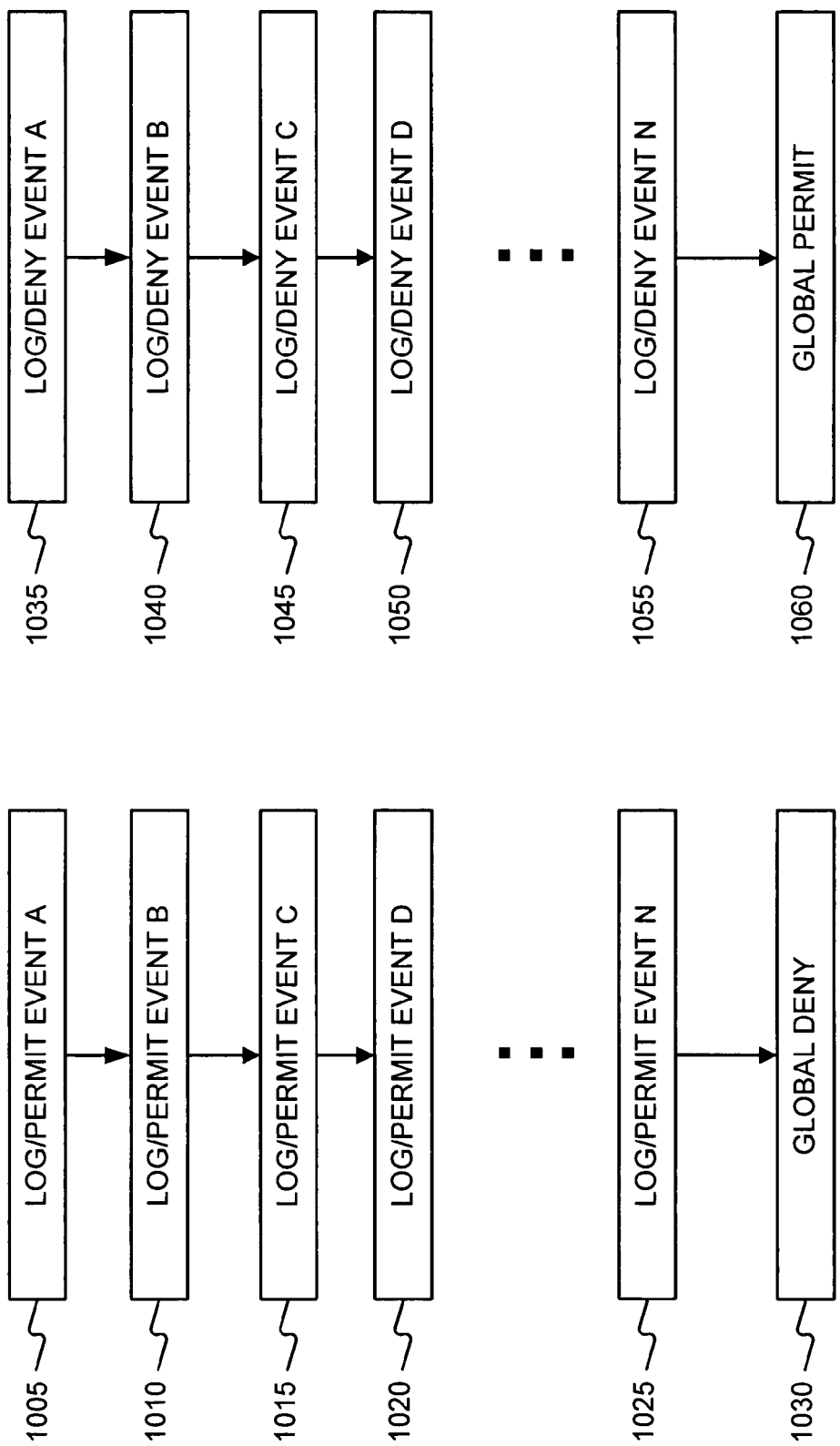
FIG. 10A is a flow diagram of a rule set, according to an embodiment of the invention.
FIG. 10B is a flow diagram of a rule set, according to an alternative embodiment of the invention.

In an embodiment of the invention, the composition and sequence of rules within a rule set are selected in a way that improves rule set processing. FIGS. 10A and 10B include two alternative rule set configurations to illustrate this point.

FIG. 10A is a flow diagram of a rule set, according to an embodiment of the invention. As shown in FIG. 10A, the rule set includes log/permit rules 1005, 1010, 1020, and 1030, in sequence, followed by global deny rule 1030. The rule set in FIG. 10A may be desirable where there is a high degree of knowledge regarding likely event data. For example, log/permit rules 1005, 1010, 1015, 1020, and 1025 may be associated with events that are known to occur and are known to be actionable. All other events are discarded by the global deny rule 1030.

FIG. 10B is a flow diagram of a rule set, according to an alternative embodiment of the invention. The rule set in FIG. 10B includes log/deny rules 1035, 1040, 1045, 1050, and 1055, in sequence, followed by global permit rule 1060. The rule set in FIG. 10B may be desirable where there is a relatively low degree of knowledge about actionable events likely to be received. Thus, log/deny rules 1035, 1040, 1045, 1050, and 1055 may be associated with events that are known to be non-actionable. All other events are permitted by the global permit rule 1060. The rule set in FIG. 10A likely promotes fewer events than the rule set in FIG. 10B.

Figure 11:
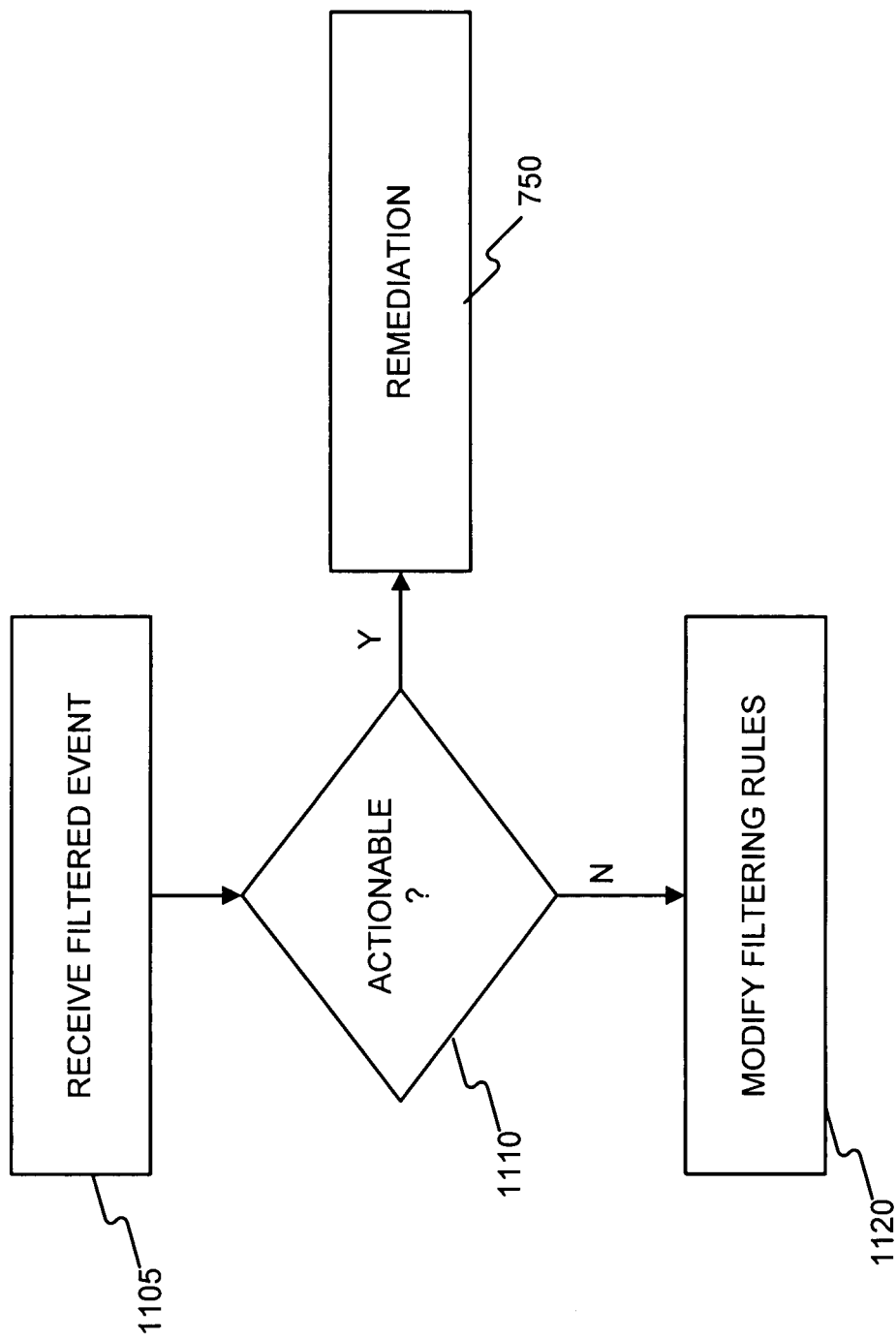
FIG. 11 is a flow diagram of a feedback process associated with the collection of event data according to an embodiment of the invention.

FIG. 11 is a flow diagram of a feedback process associated with the collection of event data according to an embodiment of the invention. As shown therein, the process begins in step 1105 by receiving a filtered event. The filtered event may be associated with one of several events received in a control center of the network management system 160 subsequent to probe filtering step 715.

Then, in conditional step 1110, it is determined whether the filtered event is actionable. An event is actionable if a user can remedy, accommodate, or take other action in response to the error or other condition associated with the event. Conditional step 1110 may be performed with reference to a database of known actionable events and/or a database of known non-actionable events. If the result of conditional step 1110 is that the filtered event is actionable, then the process advances to remediation step 750 for corrective action in response to the received event. Otherwise, the process advances to step 1120 so that one or more filtering processes, for example those discussed above with reference to steps 705, 710, and/or 715, can be modified. Separately, or in combination, step 1120 may include adding a filtering step and/or a discrete filtering rule to an existing filtering step. Separately, or in combination, step 1120 may include making an entry on a task list for the future modification of one or more existing filtering steps, or for the future addition of one or more filtering steps. Step 1120 facilitates reduction in the number of non-actionable events reaching the network management system 160 or other predetermined location of the architecture at some time in the future.

Figure 12:
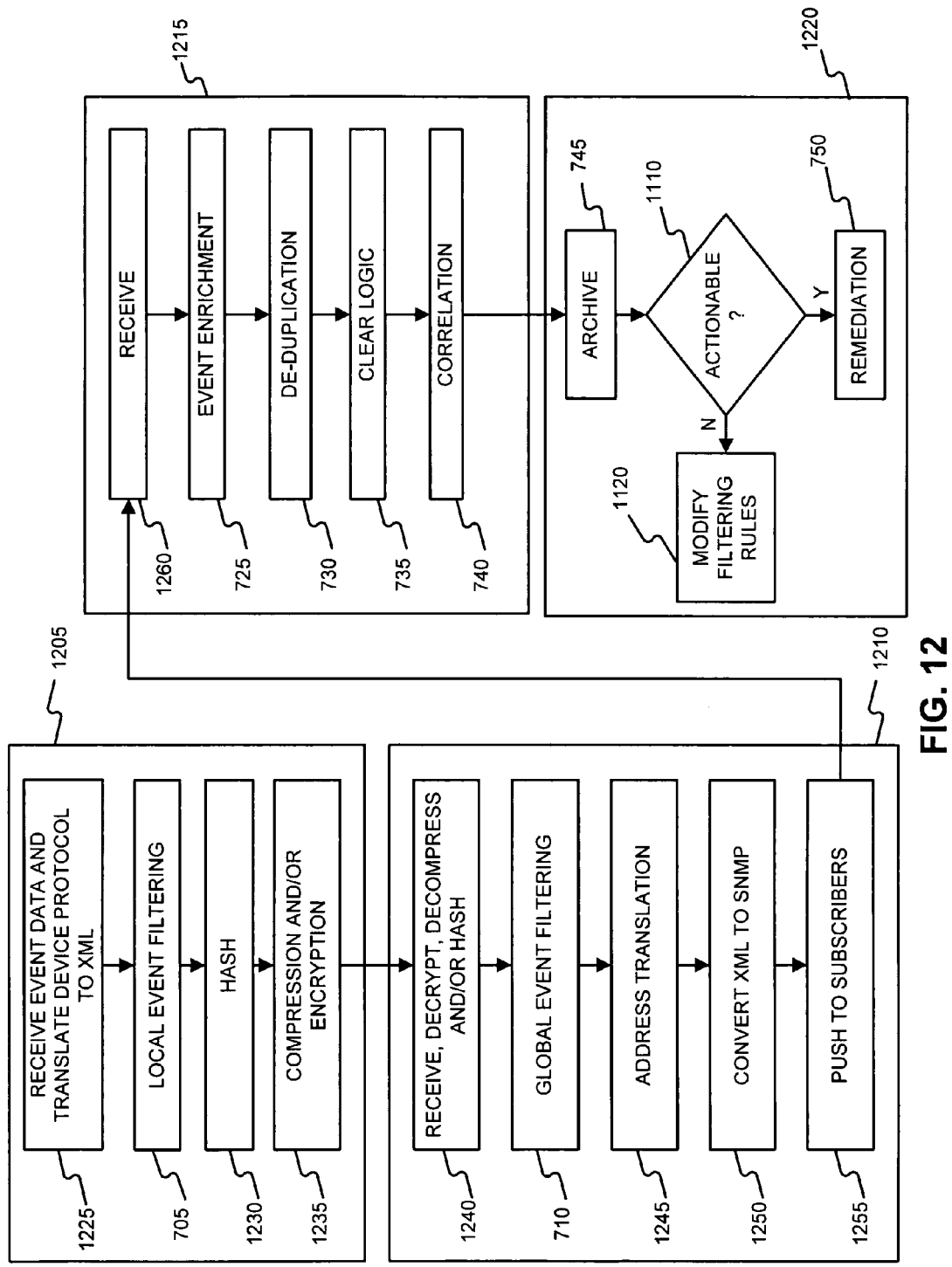
FIG. 12 is a flow diagram of an event data collection process, according to an embodiment of the invention.

FIG. 12 is a flow diagram of an event data collection process, according to an embodiment of the invention. As illustrated in FIG. 12, processes discussed above with reference to FIGS. 7 and 11 may be further integrated with additional processing steps. Step 1205 may be performed in the CTA 120; step 1210 may be performed in the CTS 140; step 1215 may be performed by a probe application; and step 1220 may be performed in a control center of the network management system 160.

Step 1225 facilitates subsequent filtering step 705 by receiving event data and translating the received event data from a native device protocol, such as Simple Network Management Protocol (SNMP), system log (SYSLOG), socket, or other native protocol, into an XML expression. The native protocol for the data received in step 1225 may be translated into an Extensible Markup Language (XML) format using predefined tags. For instance, where the native protocol for data received in step 1225 is SNMP, which has been encoded using Abstract Syntax Notation number One (ASN.1), the process may translate the native protocol in accordance with Basic Encoding Rules (BER) associated with the ASN.1 language. The XML message created in step 1225 may include the event data, a native IP address associated with the device originating the event data, and an identifier associated with the CTA 120.

Steps 1230, 1235, and 1240 operate to provide security and integrity during transmission of event data from the CTA 120 to the CTS 140.

Address translation step 1245 may begin by reading the unique CTA identifier and the native IP address from the XML expression. It should be appreciated that the CTA identifier and the native IP address form a unique combination. For example, with reference to FIG. 5, a CTA identifier associated with CTA 514 distinguishes over networks associated with CTA 512, CTA 516, and CTA 518. Moreover, within the customer network serviced by CTA 514, the native IP address associated with managed device 504 will be distinct from the native IP address associated with managed device 506. Thus, although managed devices 504 and 502 may have the same native IP address (for example where CMD 504 and CMD 502 service the networks of two separate customers), there is only one managed device associated with CTA 514 having the native IP address associated with managed device 504. Translation step 1245 may determine a new IP address based on the unique CTA identifier and native IP address. For instance, the process may consult a pre-defined table that associates the new IP address with each CTA identifier and native IP address pair. Finally, translation step 1245 may include substituting the new IP address into the XML expression (replacing the native IP address).

In step 1250, the XML data may be converted to SNMP or other device format (simulating the format of event data received in step 1225) before being pushed to subscribers in step 1255 and received by a probe in step 1260.

The embodiments of the invention described above may be used separately or in any combination, according to design choice. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for filtering event data in a network, the method comprising:
   filtering, at a client receiver platform communicatively coupled to one or more managed devices within the network, the event data at a local level to produce local event filtered data;
   filtering, at a server communicatively coupled to the client receiver platform, the local event filtered data at a global level to produce global event filtered data;
   probe filtering the global event filtered data at a network management system to produce probe filtered event data, the network management system being distinct from the server, and communicatively coupled to, the server;
   filtering, at the network management system, the probe filtered event data produce control center filtered data;
   determining whether each event in the control center filtered data is actionable;
   for each of the events, when the event is determined actionable, taking remedial action; and
   for each of the events, when the event is determined not actionable, modifying at least one of the filtering at the client receiver platform, the filtering at the server, and the probe filtering.

2. The method of claim 1, wherein the filtering at the client receiver platform and the filtering at the server are performed using a regular expression.

3. The method of claim 1, wherein the local event filtered data is produced according to a first plurality of filtering rules having a permit function, and the global event filtered data is produced according to a second plurality of filtering rules having a global deny function, wherein the first plurality of filtering rules is sequenced ahead of the second plurality of filtering rules.

4. The method of claim 1, wherein the local event filtered data is produced according to a first plurality of filtering rules having a deny function, and the global event filtered data is produced according to a second plurality of filtering rules having a global permit function, wherein the first plurality of filtering rules is sequenced ahead of the second plurality of filtering rules.

5. The method of claim 1, wherein the filtering at the client receiver platform and the filtering at the server are performed on event data that has been converted from a native device protocol to an extended markup language (XML) format.

6. The method of claim 1, wherein the probe filtering is performed using a functional module that is configured to analyze simple network management protocol (SNMP) trap data.

7. The method of claim 1, wherein the probe-filtering includes some or all of an event enrichment step, a de-duplication step, a clear logic step, and a correlation step, each performed in series.

8. The method of claim 7, wherein in the event enrichment step, a probe queries inventory and account management databases to enrich the event data with customer-specific information.

9. The method of claim 8, wherein enriched event data is used to identify those of the managed devices that should not generate actionable alarms.

10. The method of claim 7, wherein in the de-duplication step, the event data is deleted when an identical event has already been received from a common one of the managed devices.

11. The method of claim 7, wherein the clear logic step determines whether a received event cancels previously received event data.

12. The method of claim 7, wherein during the correlation step event data is associated according to predetermined criteria.

13. The method of claim 1, wherein the filtering the probe filtered event data to produce control center filtered data includes some or all of an archive step and a remediation step.

14. The method of claim 13, wherein during the archive step received event data is stored for future use.

15. The method of claim 13, wherein the remediation step involves corrective actions taken by a user at a network management console in response to the control center filtered data.

16. A processor-readable medium having instructions stored thereon, the instructions configured to perform a method, the method comprising:
   filtering, at a client receiver platform communicatively coupled to one or more managed devices within the network, the event data at a local level to produce local event filtered data;
   filtering, at a server communicatively coupled to the client receiver platform, the local event filtered data at a global level to produce global event filtered data, wherein the global event filtered data differs from the local event filtered data and wherein the filtering at the server includes applying at least one global deny that eliminates events matching a first pre-defined event from inclusion in the global event filtered data and further applying at least one global permit causing inclusion of events matching a second pre-defined event in the global event filtered data;
   probe filtering the global event filtered data at a network management system to produce probe filtered event data, the network management system being distinct from the server, and communicatively coupled to the server; and
   filtering, at the network management system, the probe filtered event data to produce control center filtered data.

17. The processor-readable medium of claim 16, the method further comprising:
   receiving a filtered event, the filtered event being an event that has been promoted by a plurality of event data filters;
   determining whether the filtered event is actionable;
   if the filtered event is actionable, taking remedial action; and
   if the filtered event is not actionable, modifying at least one of the plurality of event data filters.

18. A method for filtering event data in a network, comprising:

with a client platform, receiving a first number of events and applying local event filtering based on a local rules set to produce a set of promoted events having a second number smaller than the first number;

with a control server, receiving the promoted events and applying global event filtering based on a global rules set differing from the local rules set to produce a set of alarms having a third number smaller than the second number; and with a network management system, receiving the set of alarms from the control server, performing probe filtering based on probe filter rules differing from the global rules set to produce a set of probe-filtered alarms having a fourth number smaller than the third number, and determining a subset of the probe-filtered alarms that are actionable alarms having a fifth number smaller than the fourth number.

19. The method of claim 18, wherein the determining the actionable alarms comprises determining whether each of the probe-filtered alarms matches a known non-actionable event and, if not, promoting the probe-filtered alarm as one of the actionable alarms.

20. The method of claim 19, further comprising, when one of the probe-filtered alarms matches one of the known non-actionable events, modifying one of the local rules set, the global rules set, and the probe filter rules to deny the one of the probe-filtered alarms to reduce a number of non-actionable events being processed in later processing steps of the method.

21. The method of claim 18, wherein the probe filter rules comprise using enriched data to filter the set of alarms including identifying devices in states indicating any associated ones of the set of alarms are non-actionable.

22. The method of claim 18, wherein the probe filter rules comprise clearing logic that determines whether one of the set of alarms cancels out previously received event data and, when cancellation is determined appropriate, the method includes erasing the one of the alarms and the previously received event data.

23. The method of claim 18, wherein the local rules set comprises at least one global deny rule and at least one global permit rule, and wherein the global deny rule blocks at least one event from being included in the set of promoted events and the global permit rule allows at least one event from being included in the set of promoted events.

* * * * *

UNITED STATES PATENT AND TRADEMARK OFFICE
CERTIFICATE OF CORRECTION

PATENT NO. : 8,843,605 B2  
APPLICATION NO. : 11/151665  
DATED : September 23, 2014  
INVENTOR(S) : Seminaro et al.

Page 1 of 1

It is certified that error appears in the above-identified patent and that said Letters Patent is hereby corrected as shown below:

In the Drawings

On sheet 3 of 12, in figure 3, under Reference Numeral 122, line 1, delete "Prodictive" and insert -- Predictive --, therefor.

In the Specification

In column 7, line 39, delete "adminstrate" and insert -- administrate --, therefor.

In the Claims

In column 13, line 34, in Claim 1, after "data" insert -- to --.

Signed and Sealed this
Twenty-eighth Day of April, 2015

Michelle K. Lee
*Director of the United States Patent and Trademark Office*